United States Patent [19]

Kalal et al.

[11] 4,269,962
[45] May 26, 1981

[54] ELECTRON RESIST

[75] Inventors: Jaroslav Kalal; Bohumil Bednar; Jaromir Zachoval; Jiri Petr; Zdenek Pelcbauer, all of Prague; Frantisek Svec, Kladno, all of Czechoslovakia

[73] Assignee: Ceskoslovenska akademie ved, Prague, Czechoslovakia

[21] Appl. No.: 955,457

[22] Filed: Oct. 27, 1978

[30] Foreign Application Priority Data

Nov. 7, 1977 [CS] Czechoslovakia ............... 7258/77

[51] Int. Cl.³ .................... B41N 1/08; G03F 7/10; C08F 220/20; C08F 236/14
[52] U.S. Cl. .................. 526/273; 101/457; 101/470; 428/462; 430/288; 430/296; 430/287
[58] Field of Search .......... 427/43, 388 R, 388 A; 156/659; 96/33, 36.2; 101/457, 470; 428/462; 526/273; 430/286, 296, 287, 288

[56] References Cited

U.S. PATENT DOCUMENTS

| | | | |
|---|---|---|---|
| 3,480,441 | 11/1969 | Srinivasan | 96/36.2 X |
| 3,615,469 | 10/1971 | Ramp | 430/286 X |
| 3,787,212 | 1/1974 | Heimsch et al. | 96/36.2 X |
| 3,794,510 | 2/1974 | Scala et al. | 427/43 |
| 3,840,449 | 10/1974 | Furukawa et al. | 204/159.22 X |
| 3,865,597 | 2/1975 | Broyde | 427/43 X |
| 3,885,060 | 5/1975 | Hirai et al. | 427/43 |
| 3,931,435 | 1/1976 | Gipstein et al. | 427/43 |
| 4,038,084 | 7/1977 | Nakano et al. | 204/159.22 X |
| 4,061,799 | 12/1977 | Brewer | 427/43 |
| 4,130,424 | 12/1978 | Feit et al. | 427/43 X |

FOREIGN PATENT DOCUMENTS 1448838  9/1976  United Kingdom .................... 101/457

*Primary Examiner*—Ronald H. Smith
*Assistant Examiner*—Thurman K. Page

[57] ABSTRACT

The invention relates to a negative electron resist for application in electron lithography. It consists of an organic copolymer formed by copolymerization of butadiene or isoprene with glycidyl acrylate or glycidyl methacrylate. The resist exhibits the high sensitivity to irradiation by electrons and, at the same time, a good adhesion to the base and a resistance towards common etching agents. The copolymer is advantageously prepared by radical polymerization and a high purity of the product does not require further purification. The electron resist manufactured in this way has the long-term workability.

1 Claim, No Drawings

ELECTRON RESIST

The invention relates to an electron resist for application in the electron lithography.

The production of integrated circuits depends to a high extent on the selective etching of thin dielectric and conductive films. Polymeric films—resists are used to protect the regions which do not require to be eaten away. Recent trends in the microelectronics tend to compacted integrated circuits characterized by small dimensions and a great number of elements on single silicon plate (LSI-large scale integration).

The resolution power of photoresists exposed by light is limited by the wave lenght of employed light, light diffraction, and the characteristics of the used photographic or metallic mask. With the light of wave lenght 300 to 400 nm, the resolution power 1 to 4 $\mu$m can be achieved (0.65 $\mu$m a window, 0.35 $\mu$m the distance between windows).

The limiting conditions of an optical source may be overcome by using the electron beam of diameter of several tenths of nm, while the wave lenghts in tenths of hundreths of nm can be attained by increasing the velocity of electrons. Similarly, the resolution may be increased by application of X-rays. The lower theoretical limit of resolution power depends also on the dimensions of molecules of the polymeric material.

Submicrometer parameters can be obtained if organic polymers with the size of polymeric coils <0.01 $\mu$m are used.

Application of commercial photoresists for the purpose of electron litography did not render the results expected by the theory. The width of exposed lines exceeds several times the dimensions of electron beam, the photoresists exhibit a low sensitivity to electrons, a low contrast, and the sensitivity to scattered secondary energies which are able to initiate the decomposition of photosensitizers. Therefore, the research was directed to application of special polymers as electron resists.

Sensitivities of numerous basic synthetic polymers, as polystyrene, poly($\alpha$-methylestyrene), or polyisobutylene, are low and do not alow the practical application. The basic characteristic parameter determining the applicability of synthetic polymers is the ratio G(s) to G(x) which defines the contrast of electron resist and where G(s) is the number of cleavage reactions and G(x) is the number of crosslinking reactions per 100 eV. The reactions of both kinds take place simultaneously in the system during irradiation of the polymer by electron beam. The polymers which exhibit a high value of G(s), as polymethyl methacrylate [G(s)~1.7] or polyolefin sulfones [G(s)~11.0], were used for the positive types of electron resists (FRG Pat. No. 2,518,479; U.S. Pat. No. 3,931,435; U.S. Pat. No. 3,916,036; FRG Pat. No. 2,512,745; U.S. Pat. No. 3,898,350; Jap. Pat. No. 75-50 041; U.S. Pat. No. 3,893,127).

The sensitivity of most of positive electron resists ranges between $5\times10^{-5}$ and $4\times10^{-6}$ C.cm$^{-2}$. The sensitivity of negative types of electron resists depends on the value G(s), which increases with the content of double bonds in the polymer and with the content of epoxide groups. The modification of poly methyl methacrylate by pendant vinyl groups changes the sensitivity of polymer towards irradiation with electron beam and transfers the polymer to a negative resist (FRG Pat. No. 2,336,517). Lowering of the glass transition temperature $T_g$ by introduction of ethylacrylate and glycidyl methacrylate into the chain of polymethyl methacrylate increases the sensitivity of resist and its adhesion to the surface of substrate (L. F. Thompson: Solid-state Technology, 1974, p. 27). A disadvantage of this type of resists consists in their limited "pot live time" and in the complicated preparation. The presence of crosslinking agents based on epoxides enhanced the adhesion of resist and its sensitivity (Fr. Pat. No. 2,250,138). Application of special sensitizers for the negative type of resists (FRG Pat. No. 2,426,449; U.S. Pat. No. 3,829,369) is also described.

Introduction of an epoxide group into the chain of polybutadiene by epoxidization with peroxoacetic acid increases the sensitivity up to $4\times10^{-9}$ C.cm$^{-2}$ (U.S. Pat. No. 3,885,060; Jap. Pat. No. 75-33 826; Jap. Pat. No. 74-84 656). However, the epoxidized polybutadiene has to be fractionated by a fractional precipitation and the fraction with higher content of epoxide groups has to be used to achieve the above sensitivity, which in fact makes this method disadvantageous. Another disadvantage of the electron resist according to the above mentioned U.S. Patent consists in a number of side reactions taking place in the epoxidization of polybudtadiene, as branching, crosslinking, and destruction of polymer chains. These reactions result in the increase of width of distribution, i.e. in the increase of polydispersity, and negatively affect the value of contrast. Pot live time of the epoxidized polybutadiene is limited because of its limited stability. In addition to this, these electron resists contain metals from a catalyst system which interfere in the further processing. The copolymers of acrylonitrile with glycidyl methacrylate must be also worked out within 24 hours [L. F. Thompson, E. D. Flit, R. D. Heidenreich: Polymer Sci. Eng. 14, 529 (1974)].

The above mentioned shortcomings are avoided by the electron resist for electron litography according to this invention, wherein the electron resist is formed by copolymers of glycidyl acrylate or glycidyl methacrylate with monomers, selected from the group consisting of butadiene-1,3 or isoprene, wherein said copolymers contain 20 to 65 mol. % of glycidyl methacrylate or glycidyl acrylate and have the molecular weight in the region of 4,000 to 90,000.

This electron resist contain in the polymer chain the group I, II, III and IV

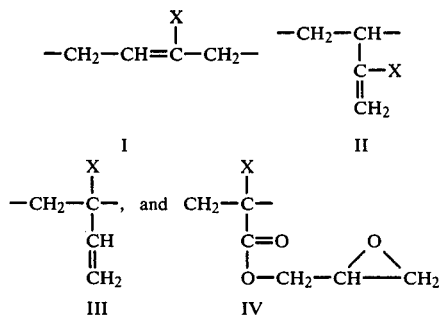

wherein X is H or CH$_3$

The following diene monomers may be used, for example, in the preparation of copolymers: butadiene-1,3, isoprene, pentadiene, but advantageously butadiene-1,3 and isoprene. Glycidyl methacrylate and glycidyl acrylate can be used as comonomers.

All kinds of copolymers of dienes with glycidyl acrylate and glycidyl methacrylate may be advantageously prepared by a radically initiated copolymerization in bulk or in solution and need not be further fractionated or refined in a special way, as it is in the method according to U.S. Pat. No. 3,885,060. The aforementioned copolymers combine in their properties a high sensitivity towards electron irradiation and an excellent adhesion to the surface of substrate, e.g. to the polished surfaces of silicon dioxide and to surfaces of metals. Organic solvents may be used as developers, e.g. aliphatic and aromatic hydrocarbons, ketones, ethers, and the like. Neither preparation nor application of the copolymers of dienes with glycidyl acrylate and methacrylate as electron resists require the presence of compounds containing elements which unfavourably affect the yields in the technology of integrated circuits. For stripping of the resists based on the aforesaid copolymers, it is possible to use the technologies developed for stripping of commercial photoresists. Adhesion of the copolymers to all types of surfaces and the resistance of resist towards etching solutions can be increased by heating of the hardened and developed polymeric film at temperatures 100°–180° C. for 3 to 30 min, depending on the type of copolymer, thickness of the resist film, and the type of developer used. Adjustment of the required properties of the electron resist based on the aforesaid copolymers may be carried out in a broad region through the choice of ratio of monomers, changes of molecular weight or also, of polydispersity. In addition to these advantages, several others can be mentioned in comparison with the method described in U.S. Pat. No. 3,885,060, as e.g. the possibility of direct preparation of an ash-less resist without special purification. Another advantage of the electron resist according to this invention consists in its anhanced stability towards the spontaneous hardening in solution and in film at the preserved high sensitivity.

The objective of the invention is further illustrated in following examples of performance:

EXAMPLE 1

A copolymer of butadiene-1,3 with glycidyl methacrylate, containing 24.44 mol. % of glycidyl methacrylate and having $\overline{M}_n = 4420$ and $\overline{M}_w = 8350$, was prepared by the radical copolymerization in benzene solution initiated with 0.6 mol. % of 2,2'-azobis(isobutyronitrile) at 70° C. The polymer was applied to silicon plates with the 0.4 μm layer of silicon dioxide as a xylene solution in a centrifuge at 3000 r.p.m. The solvent was removed after application of the layer by drying at 30° C. and the pressure 1.33 Pa for 48 hours. The thickness of the layer of polymer resist was after drying 0.4 μm. Irradiation of the resist was carried out by an electron gun with the accelerating voltage 35 kV. The crosslinked copolymer exhibited a very good adhesion to the base and an excellent resistance towards common etching agents at the resulting exposure $5.1 \times 10^{-7}$ C.cm$^{-2}$, after development in benzene and the subsequent heating to 120° C. for 15 min.

EXAMPLE 2

A copolymer of butadiene-1,3 with glycidyl methacrylate, containing 36.84 mol.% of glycidyl methacrylate and having $\overline{M}_n = 10,500$ and $\overline{M}_w = 28,300$, was prepared by the method described in Example 1. The application of resist, exposure, and development were carried out as described in Example 1. The crosslinked copolymer exhibited a good adhesion to a base and a very high resistance towards common etching agents at the resulting value of exposure $1.02 \times 10^{-8}$ C.cm$^{-2}$ and after an additional heating to 100° C. for 8 min.

EXAMPLE 3

A copolymer of butadiene-1,3 wih glycidyl methacrylate, containing 55.79 mol.% of glycidyl methacrylate and having $\overline{M}_n = 20,200$ and $\overline{M}_w = 77,000$, was prepared by the radical copolymerization in bulk under initiation with 0.4 mol.% of 2,2'-azobis(isobutyronitrile) at 70° C. The application, exposure, and development were carried out similarly as in Example 1. The crosslinked copolymer exhibited, at the final value of exposure $6.12 \times 10^{-8}$ C.cm$^{-2}$, a very good adhesion to a base and an excellent resistance towards common etching agents. A solution of this polymer was repeatedly applied during 3 months under the same conditions and no change in sensitivity was found.

EXAMPLE 4

A copolymer of isoprene with glycidyl methacrylate, containing 62 mol.% of glycidyl methacrylate and having $\overline{M}_n = 30,000$ and $\overline{M}_w = 65,200$, was prepared by the radically initiated copolymerization in benzene with 0.4 mol.% of 2,2'-azobis(isobutyronitrile) at 70° C. The application of resist layer, exposure, and development were carried out by the method described in Example 1. The crosslinked copolymer exhibited, at the final value of exposure $8.0 \times 10^{-7}$ C.cm$^{-2}$, a good adhesion to a base and an excellent resistance towards common etching agents.

EXAMPLE 5

A copolymer of butadiene-1,3 with glycidyl acrylate, containing 24.3 mol.% of glycidyl acrylate and having $\overline{M}_n = 19,800$ and $\overline{M}_w = 40,500$, was prepared by the radical copolymerization in the 1,4-dioxan solution initiated with 0.6 mol.% of 2,2'-azo-bis(isobutyronitrile) at 60° C. The application of resist, exposure, and development were carried out similarly as in Example 1. The polymeric film exhibited, at the final value of exposure $5 \times 10^{-8}$ C.cm$^{-2}$, a very good adhesion to a base and an excellent resistance towards common etching agents.

EXAMPLE 6

A copolymer of butadiene-1,3 and glycidyl acrylate, containing 45.6 mol.% of glycidyl acrylate, was prepared by the solution polymerization in benzene initiated with 0.4 mol.% of 2,2'-azibis(isobutyronitrile) at 60° C. The polymer was applied to polished aluminium plates as a 30 wt.% xylene solution in a centrifuge at 3000 r.p.m. The exposure and development were carried out the by method used in Example 2. The crosslinked copolymer exhibited a very good adhesion to the base and an excellent resistance towards common etching agents at the final value of exposure $1 \times 10^{-8}$ C.cm$^{-2}$.

EXAMPLE 7

A copolymer of isoprene with glycidyl acrylate, containing 36 mol.% of glycidyl acrylate, was prepared by the radical copolymerization by the procedure described in Example 5. The application of resist layer, exposure, and development were carried out by the method according to Example 1. The crosslinked copolymer exhibited, at the final value of exposure $6 \times 10^{-7}$ C.cm$^{-2}$, a good adhesion to a base and an excellent resistance towards common etching agents.

We claim:

1. An electron resist for electron lithography formed by copolymers of glycidyl methacrylate or glycidyl acrylate with monomers, selected from the group consisting of butadiene-1,3 or isoprene, wherein said copolymers contain 20 to 65 mol. % of glycidyl methacrylate or glycidyl acrylate and have the number average molecular weight in the region of 4,000 to 90,000.

* * * * *